(12) United States Patent  (10) Patent No.: US 9,222,982 B2
Kim  (45) Date of Patent: Dec. 29, 2015

(54) TEST APPARATUS AND OPERATING METHOD THEREOF

(71) Applicant: SK hynix Inc., Gyeonggi-do (KR)

(72) Inventor: Ki-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 157 days.

(21) Appl. No.: 14/105,383

(22) Filed: Dec. 13, 2013

(65) Prior Publication Data

US 2014/0380110 A1  Dec. 25, 2014

(30) Foreign Application Priority Data

Jun. 20, 2013  (KR) ........................ 10-2013-0071000

(51) Int. Cl.
*G01R 31/28* (2006.01)
*G01R 31/3185* (2006.01)

(52) U.S. Cl.
CPC ..... *G01R 31/318555* (2013.01); *G01R 31/318508* (2013.01)

(58) Field of Classification Search
CPC ............... G01R 31/318555; G01R 31/318508
See application file for complete search history.

(56) References Cited

U.S. PATENT DOCUMENTS

2008/0265906 A1* 10/2008 Waayers ................ 324/537
2013/0024737 A1* 1/2013 Marinissen et al. ........ 714/727

FOREIGN PATENT DOCUMENTS

KR  1020060095283  8/2006
KR  1020090022209  3/2009

* cited by examiner

*Primary Examiner* — Sam Rizk
(74) *Attorney, Agent, or Firm* — IP & T Group LLP

(57) ABSTRACT

A test apparatus includes a test apparatus may include a core suitable for accommodating a semiconductor device to be tested, a wrapper data register suitable for storing data used for testing the semiconductor device, and a bandwidth controller suitable for adaptively controlling a data bandwidth between the core and the wrapper data register according to the semiconductor device to be tested.

8 Claims, 3 Drawing Sheets

FIG. 3

| TM_ENT | A<7> | A<6> | A<5> | A<4> | A<3> | A<2> | A<1> | A<0> | DET<0> | DET<1> | DQ<0> | DQ<1> | DQ<2> | DQ<3> |

TEST APPARATUS AND OPERATING METHOD THEREOF

CROSS-REFERENCE TO RELATED APPLICATIONS

The present application claims priority of Korean Patent Application No. 10-2013-0071000, filed on Jun. 20, 2013, which is incorporated herein by reference in its entirety.

BACKGROUND

1. Field

Exemplary embodiments of the present invention relate to a semiconductor design technology, and more particularly, to a test apparatus for testing a semiconductor device, and a method thereof.

2. Description of the Related Art

Electronic appliances which are produced in these days may be designed to perform a smart operation in order to meet the needs of consumer. To implement this operation, various semiconductor chips such as a microprocessor, a networking chip, a memory, or the like are provided in the electronic appliances, and a secure and fast communication between the semiconductor chips in the electronic appliances may be more important due to complex and diverse trends of the electric appliances.

A System on Chip (SoC) technique is emerging that a plurality of semiconductor chips are organically connected and act as a single chip. In the SoC technique, a microprocessor, a digital processor, a memory, a baseband chip and the like are integrated in a single chip so that the single chip itself may function as a system. The SoC technique may have many advantages in terms of system cost and size of circuits, and the SoC technique may be expanding throughout an Information Technology (IT) industry as well as a semiconductor industry due to those advantages.

In the SoC technique, a memory and a non-memory required for a system are integrated in a single chip. A distinction between companies for manufacturing, production, and design of the SoC is becoming ambiguous, and thus the overall technical and market competition is getting fierce. In particular, since the SOC technique essentially requires a nanometer-scale deep-submicron process technology and a software technology, a competition to secure those technologies is expected to become more intense.

Meanwhile, due to a development of a semiconductor manufacturing technology and a design technology, high-performance products are possible to be produced. At this time, to test circuits inside a SoC, additional configurations are required as follows.

First, the existing test equipment may not be used in the SoC technology since concerns such as noise, signal delay, interference, and the like become important due to an ultra-fine process. Accordingly, a cost to purchase a new test apparatus and a time for developing the desired test may be required. Further, it may be difficult to test the SoC since it may be difficult to acquire interconnections required for a test between an input/output of the SoC between an input/output of core. In other words, plural cores are built inside the SoC but it may be difficult to separately provide each core with a respective pin for the test. Thus, a test apparatus and a test method are required to test the plural cores provided inside the SoC by using minimal test pins.

In the end, because it may be difficult to acquire additional pins required for testing the plural cores, and to couple an input/output of the SoC with inputs/outputs of the plural cores, a test apparatus for testing the SoC requires a unique test structure.

Meanwhile, a plurality of cores are provided in the SoC, and the cores are coupled to each other by a plurality of connecting lines. In the conventional SoC, it may be enough to test the SoC by testing static faults such as a stuck-at fault, an open-net fault, a shorted-net fault, or the like since reliability of a data transfer is only checked regardless of checking a speed during testing the connecting lines. However, in case of an SoC operating at a high speed, an additional test operation may require since a signal delay of the connecting lines causes the entire SoC to malfunction.

SUMMARY

Various exemplary embodiments of the present invention are directed to a test apparatus for testing a semiconductor device, and a method thereof, capable of performing various test operations on a System on Chip (SoC).

In accordance with an exemplary embodiment of the present invention, a test apparatus may include a core suitable for accommodating a semiconductor device to be tested, a wrapper data register suitable for storing data used for testing the semiconductor device, and a bandwidth controller suitable for adaptively controlling a data bandwidth between the core and the wrapper data register according to the semiconductor device to be tested.

In accordance with an exemplary embodiment of the present invention, a test apparatus may include a core suitable for accommodating semiconductor devices to be tested, a plurality of data registers corresponding to the semiconductor devices, suitable for storing data required for a respective test operation of the semiconductor devices, a common data register suitable for storing data required for a common test operation of the semiconductor devices, and a wrapper command register suitable for adaptively controlling the test operations of the plurality of data registers and the common data register.

In accordance with an exemplary embodiment of the present invention, a method of operating a test apparatus may include performing a first test operation on a first semiconductor device based on a first data bandwidth corresponding to the first semiconductor device, performing a second test operation on a second semiconductor device based on a second data bandwidth corresponding to the second semiconductor device, and performing a common test operation on the first and second semiconductor devices based on data stored on a common data register.

BRIEF DESCRIPTION OF THE DRAWINGS

FIG. 3 is a diagram illustrating a common test data resister shown in FIG. 2.

DETAILED DESCRIPTION

Figure 1:
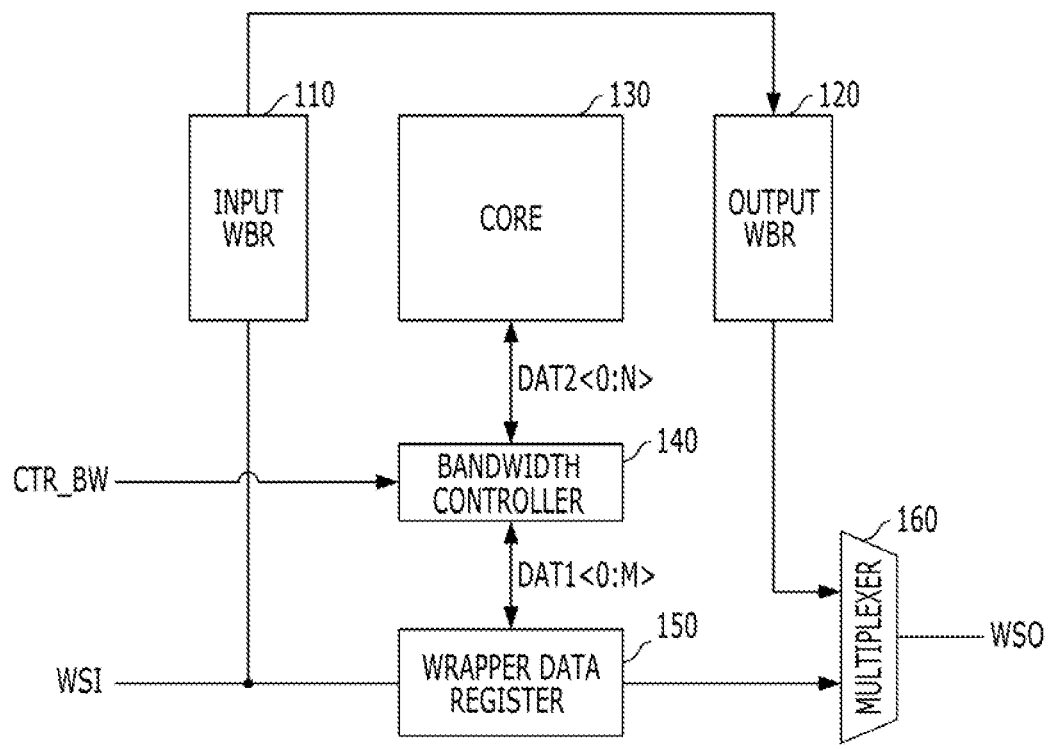
FIG. 1 is a block diagram illustrating a test apparatus in accordance with an exemplary embodiment of the present invention.

Various exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a test apparatus in accordance with an exemplary embodiment of the present invention.

Referring to FIG. 1, the test apparatus includes an input wrapper boundary register (WBR) 110, an output wrapper boundary register (WBR) 120, a core 130, a bandwidth controller 140, a wrapper data register 150, and a multiplexer 160.

The input WBR 110 and the output WBR 120 serve to perform a parallel test operation of the core 130, and serve to interface between the core 130 and the external. The core 130 includes a region where a semiconductor device to be tested is disposed. Thus, the core 130 may accommodate the semiconductor device to be tested. The bandwidth controller 140 controls a data bandwidth between the core 130 and the wrapper data register 150 in response to a bandwidth control signal CTR_BW. Hereinafter, the data bandwidth between the core 130 and the wrapper data register 150 is referred to as a 'test input/output bandwidth'. Here, the bandwidth control signal CTR_BW includes information about the test input/output bandwidth of the semiconductor device to be tested. The wrapper data register 150 stores data transferred through a wrapper serial input signal WSI. The stored data are transferred to the semiconductor device accommodated in the core 130 under the control of the bandwidth controller 140 to be used during the test. The multiplexer 160 outputs a wrapper serial output signal WSO by selecting one of a boundary test operation result of the input WBR 110 and the output WBR 120, and a test operation result of the wrapper data register 150.

Hereinafter, an operation of the test apparatus is described in detail. For illustrative purposes, a process for transferring data transferred through the wrapper serial input signal WSI to the core 130 is described as a representative.

First, the data for testing the semiconductor device included in the core 130 are transferred through the wrapper serial input signal WSI, and stored in the wrapper data register 150. Meanwhile, a first signal group DAT1<0:M> outputted from the wrapper data register 150 has bandwidth identical to a maximum test input/output bandwidth (M+1) of the semiconductor device to be tested, where M represents a positive integer. Subsequently, the bandwidth controller 140 receives and adjusts the first signal group DAT1<0:m> to the test input/output bandwidth of the semiconductor device to be tested, and outputs a second signal group DAT2<0:N> in response to the bandwidth control signal CTR_BW, where N is a positive integer less than or identical to M. As a result, the semiconductor device to be tested may perform a test operation based on the second signal group DAT2<0:N> corresponding to its test input/output bandwidth.

The test apparatus in accordance with the exemplary embodiment may adaptively control the test input/output bandwidth between the core 130 and the wrapper data register 150, according to the semiconductor device to be tested. That is, the test apparatus may test a respective semiconductor device using an optimized test input/output bandwidth.

For reference, although the exemplary embodiment explains a case where the data stored in the wrapper data register 150 is transferred to the core 130 as an example, a case where a test operation is performed in the core 130, and the test result is transferred to the wrapper data register 150 from the core 130 may be applicable. That is, the test input/output bandwidth may be defined in consideration of input data and output data FIG. 2 is a block diagram illustrating a test apparatus in accordance with another exemplary embodiment of the present invention.

Figure 2:
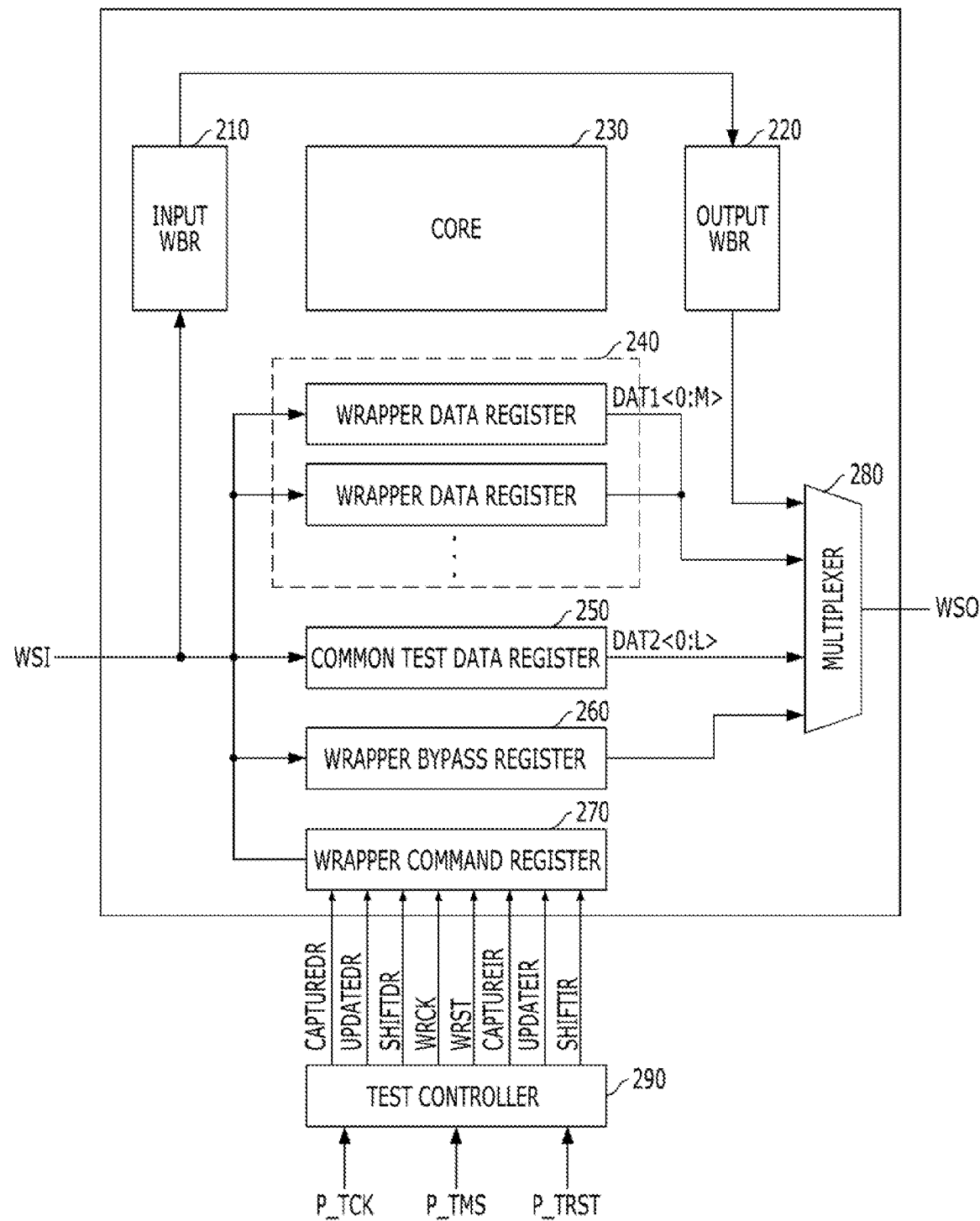
FIG. 2 is a block diagram illustrating a test apparatus in accordance with another exemplary embodiment of the present invention.

Referring to FIG. 2, the test apparatus includes an input wrapper boundary register (WBR) 210, an output wrapper boundary register (WBR) 220, a core 230, a plurality of wrapper data registers 240, a common test data register 250, a wrapper bypass register 260, a wrapper command register 270, a multiplexer 280, and a test controller 290.

The input WBR 210 and the output WBR 220 serve to perform a parallel test operation of the core 230, and serve to interface between the core 230 and the external. The core 230 includes a region where a semiconductor device to be tested are disposed. Thus, the core 230 may accommodate the semiconductor device to be tested. In the core 230, homo-semiconductor devices or hetero-semiconductor devices may be disposed in the core 230. Here, the hetero-semiconductor devices denote a case where a plurality of semiconductor chips which operate in synchronization with different clocks from each other are disposed in a SoC, and the homo-semiconductor devices denote a case where at least one semiconductor chip which operates in synchronization with a clock is disposed in a SoC.

The plurality of wrapper data registers 240 store data required for a respective test operation of the semiconductor to be tested, and the common test data register 250 stores data required for a common test operation of the semiconductor devices to be tested. For example, when each of first and second semiconductor device is tested, two in the plurality of wrapper data registers 240 are provided for first and second test operations of the first and second semiconductor devices, respectively, and the common test data register 250 is provided for the common test operation of the first and second semiconductor devices. A data bandwidth of the common test data register 250 may be different from a data bandwidth of the plurality of wrapper data registers 240.

The wrapper bypass register 260 forms a bypass path between a wrapper serial input signal WSI and a wrapper serial output signal WSO. The wrapper command register 270 controls the plurality of wrapper data registers 240 and the common test data register 250 to test the semiconductor device disposed in the core 230.

The test controller 290 controls the input WBR 210, the plurality of wrapper data registers 240, the common test data register 250, the wrapper bypass register 260, and the wrapper command register 270 by generating control signals for controlling operations of the registers, such as CAPTUREDR, UPDATEDR, SHIFTDR, CAPUTREIR, UPDATEIR, and SHIFTIR, a test clock WRCK for the registers, and a reset signal WRST, in response to a test clock P_TCK, a test mode signal P_TMS, and a test reset signal P_TRST. According to the signals generated by the test controller 290, one of the plurality of wrapper data registers 240 and the common test data register 250 is activated. The multiplexer 280 outputs the wrapper serial output signal WSO by selecting one output of the output WBR 220, the plurality of wrapper data registers 240, the common test data register 250, and the wrapper bypass register 260.

As described above, the test apparatus in accordance with the embodiment may perform a respective test operation corresponding to one of the semiconductor devices disposed in the core 230, and may perform a common test operation corresponding to the semiconductor devices to be tested.

FIG. 3 is a diagram illustrating the common test data resister 250 shown in FIG. 2.

For illustrative purposes, a case of the common test data resister 250 having 15 data cells is described as a representative.

Referring to FIG. 3, the common test data register 250 includes circuits for storing a timing information TM_ENT of the test operation, addresses A<0:7> for setting various test modes, a test result information DET<0:1>, and a data information DQ<0:3> about data which are inputted/outputted during the test operation. As illustrated in FIG. 2, the common test data register 250 stores data required for the common test operation of the semiconductor devices to be tested.

Accordingly, the test apparatus in accordance with the embodiment may perform the common test operation of the semiconductor devices to be tested using the common test data register 250.

As described above, the test apparatus in accordance with the embodiment may detect information about a test input/output bandwidth of a semiconductor device to be tested. Further, the test apparatus in accordance with the exemplary embodiment may select a corresponding register in response to the information, and thus a test input/output bandwidth between the semiconductor device and the register may be optimized according to the semiconductor device to be tested.

Furthermore, the test apparatus in accordance with the embodiment may accurately analyze a failure to the semiconductor device to be tested according to various test result.

While the present invention has been described with respect to the specific embodiments, it will be apparent to those skilled in the art that various changes and modifications may be made without departing from the spirit and scope of the invention as defined in the following claims.

What is claimed is:

1. A test apparatus comprising:
    a core suitable for accommodating a semiconductor device to be tested;
    a wrapper boundary register suitable for performing a parallel test operation of the semiconductor device;
    a wrapper data register suitable for storing data transferred through a wrapper serial input signal and used for testing the semiconductor device; and
    a bandwidth controller suitable for adaptively controlling a data bandwidth between the core and the wrapper data register according to the semiconductor device to be tested.

2. The test apparatus of claim 1, wherein the bandwidth controller is suitable for controlling the data bandwidth in response to a control signal having information corresponding to the semiconductor device to be tested.

3. The test apparatus of claim 1, wherein data between the core and the bandwidth controller have a first bandwidth, and data between the bandwidth controller and the wrapper data register have a second bandwidth, the first bandwidth being less than or identical to the second bandwidth.

4. A test apparatus comprising:
    a core suitable for accommodating semiconductor devices to be tested;
    a plurality of data registers corresponding to the semiconductor devices, suitable for storing data required for a respective test operation of the semiconductor devices;
    a common data register suitable for storing data required for a common test operation of the semiconductor devices, wherein one of the plurality of wrapper data registers and the common test data register is activated, and a data bandwidth of the common data register is different from a data bandwidth of the plurality of data registers; and
    a wrapper command register suitable for adaptively controlling the test operations of the plurality of data registers and the common data register according to the semiconductor devices to be tested.

5. The test apparatus of claim 4, further comprising:
    a wrapper boundary register suitable for performing a parallel test operation of the semiconductor devices; and
    a wrapper bypass register for forming a bypass path between input data and output data of the semiconductor devices,
    wherein one of the plurality of wrapper data registers, the common test data register, the wrapper boundary register, and the wrapper bypass register is activated.

6. The test apparatus of claim 1, wherein the common data register stores timing information of the test operations, address information for setting test modes, and test data information corresponding to data which are inputted/outputted during the test operations.

7. A method of operating a test apparatus, the method comprising:
    performing a first test operation on a first semiconductor device based on a first data bandwidth corresponding to the first semiconductor device;
    performing a second test operation on a second semiconductor device based on a second data bandwidth corresponding to the second semiconductor device; and
    performing a common test operation on the first and second semiconductor devices based on data stored on a common data register,
    wherein a data bandwidth of the common test operation is different from data bandwidths of the first test operation and the second test operation.

8. The method of claim 7, wherein the common data register stores timing information of the test operations, address information for setting test modes, and test data information corresponding to data which are inputted/outputted during the test operations.

* * * * *